United States Patent
Lee

(10) Patent No.: US 7,741,203 B2
(45) Date of Patent: Jun. 22, 2010

(54) METHOD OF FORMING GATE PATTERN OF FLASH MEMORY DEVICE INCLUDING OVER ETCH WITH ARGON

(75) Inventor: In No Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 28 days.

(21) Appl. No.: 11/962,393

(22) Filed: Dec. 21, 2007

(65) Prior Publication Data

US 2008/0242074 A1    Oct. 2, 2008

(30) Foreign Application Priority Data

Mar. 27, 2007    (KR) .................. 10-2007-029626

(51) Int. Cl.
H01L 21/38   (2006.01)
H01L 21/302  (2006.01)
H01L 21/461  (2006.01)

(52) U.S. Cl. .................. 438/594; 438/717; 438/754

(58) Field of Classification Search .............. 438/717, 438/754, 594; 257/E21.232
See application file for complete search history.

(56) References Cited

U.S. PATENT DOCUMENTS 5,437,765 A * 8/1995 Loewenstein .............. 216/51

2002/0197837 A1 * 12/2002 Kwak et al. ................ 438/585
2007/0281477 A1 * 12/2007 Lee et al. ................... 438/689
2008/0020583 A1 * 1/2008 Ueda et al. ................ 438/717

FOREIGN PATENT DOCUMENTS

KR    102006012097    11/2006

* cited by examiner

Primary Examiner—William M. Brewster
(74) Attorney, Agent, or Firm—Marshall, Gerstein & Borun LLP

(57) ABSTRACT

A method of forming a gate pattern of a flash memory device may include forming a tunnel dielectric layer, a conductive layer for a floating gate, a dielectric layer, a conductive layer for a control gate, a metal electrode layer, and a hard mask film over a semiconductor substrate. The metal electrode layer may be etched such that a positive slope of an upper sidewall may be formed larger than a positive slope of a lower sidewall of the metal electrode layer. The conductive layer for the control gate, the dielectric layer, and the conductive layer for the floating gate may then be etched. High molecular weight argon gas, for example, may be used to improve an anisotropic etch characteristic of plasma. Over etch of a metal electrode layer may be decreased to reduce a bowing profile. Resistance of word lines can be decreased and electrical properties can be improved.

16 Claims, 3 Drawing Sheets

METHOD OF FORMING GATE PATTERN OF FLASH MEMORY DEVICE INCLUDING OVER ETCH WITH ARGON

CROSS-REFERENCES TO RELATED APPLICATIONS

Priority is claimed to Korean patent application number 10-2007-29626 filed on Mar. 27, 2007, the disclosure of which is incorporated by reference in its entirety.

FIELD OF THE INVENTION

The present invention relates to a method of forming a gate pattern of a flash memory device and, more particularly, to a method of forming a gate pattern of a flash memory device that can reduce word line resistance of the flash memory device.

BACKGROUND OF THE INVENTION

In general, a flash memory cell includes a gate in which a tunnel dielectric layer, a floating gate, a dielectric layer, and a control gate are laminated over a semiconductor substrate, and a junction region is formed over the semiconductor substrate on both sides of the gate. As hot electrons are injected into the floating gate, data is programmed into the flash memory cell, and, as injected electrons are discharged by F-N tunneling, data programmed into the flash memory cell is erased.

FIG. 1 is a sectional view illustrating a conventional method of forming a gate pattern of a flash memory device.

Referring to FIG. 1, a tunnel dielectric layer 11, a conductive layer 12 for a floating gate, a dielectric layer 13, a conductive layer 14 for a control gate, a metal electrode layer 15, and hard mask films 16, 17 are sequentially laminated over a semiconductor substrate 10. A patterning process is then performed to form a gate pattern.

In recent years, as semiconductor devices are becoming more highly integrated, the size of the pattern is decreased. Lateral damage at the time of an etch process of a gate pattern causes a bowing profile to occur. In particular, damage to the sidewalls of the metal electrode layer 15, occurring at the time of an etch process of the dielectric layer, results in increased resistance of word lines. Accordingly, the operation of a device becomes slow and electrical properties are degraded.

BRIEF SUMMARY OF THE INVENTION

Various embodiments of the present invention are directed towards a method of forming a gate pattern of a flash memory device that can improve an anisotropic etch characteristic of plasma by using, for example, an argon (Ar) gas having a high molecular weight at the time of an etch process of the gate pattern, and reduce a bowing profile by decreasing over etch of a metal electrode layer, thereby decreasing resistance of word lines and improving electrical properties.

In an embodiment of the present invention, a method of forming a gate pattern of a flash memory device may include forming a tunnel dielectric layer, a conductive layer for a floating gate, a dielectric layer, a conductive layer for a control gate, a metal electrode layer, and a hard mask film over a semiconductor substrate, etching the metal electrode layer by performing an etch process employing the hard mask film, thus exposing the conductive layer for the control gate, and etching the exposed conductive layer for the control gate, the dielectric layer, and the conductive layer for the floating gate.

In the etching of the metal electrode layer, a positive slope of an upper sidewall of the metal electrode layer may be formed larger than a positive slope of a lower sidewall of the metal electrode layer.

In an embodiment of the present invention, the hard mask film may include, for example, an oxide film, an amorphous carbon layer, a silicon oxynitride (SiON) layer, and an Anti-Reflective Coating (ARC) layer. The conductive layer for the floating gate and the conductive layer for the control gate may be formed, for example, from a polysilicon film. The metal electrode layer may be formed, for example, from tungsten silicide ($WSi_x$). The metal electrode layer may be formed using, for example, a Monosilane (MS) or Dichlorosiline (DCS) method.

In an embodiment of the present invention, the etch process of the metal electrode layer may include a first etch process performed using the metal electrode layer as a target, and a second etch process of over etching the metal electrode layer.

In an embodiment of the present invention, the first etch process may be performed using an Ar gas, nitrogen trifluoride ($NF_3$) of approximately 20 to 30 sccm, a source power of approximately 800 to 1200 W, and a bias power of approximately 40 to 100 W in a low pressure range of approximately 4 to 10 mT. The second etch process may be performed by setting the over etch target to approximately 20 to 40%. Further, the second etch process may be performed using nitrogen difluoride ($NF_2$) gas, chlorine ($Cl_2$) gas, and Ar gas. The first and second etch processes may be performed in inductively coupled plasma (ICP) type equipment. The etch step of the conductive layer for the control gate and the dielectric layer may be performed in-situ with the etch step of the metal electrode layer.

DESCRIPTION OF SPECIFIC EMBODIMENTS

Preferred embodiments of the present invention will be described with reference to the accompanying drawings. These embodiments are used only for illustrative purpose, the invention is not limited thereto.

Figure 1:
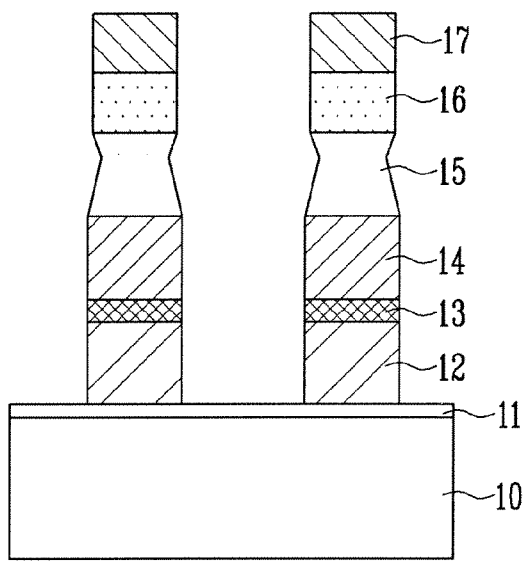
FIG. 1 is a sectional view illustrating a conventional method of forming a gate pattern of a flash memory device.
Figure 2:
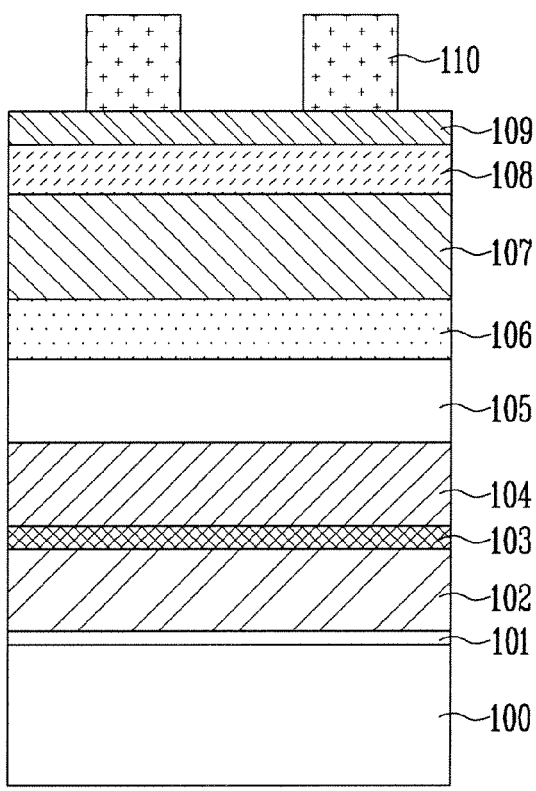
FIGS. 2 to 5 are sectional views illustrating a method of forming a gate pattern of flash memory device according to an embodiment of the present invention.

Referring to FIG. 2, a tunnel dielectric layer 101 may be formed on a semiconductor substrate 100. The tunnel dielectric layer 101 may be formed, for example, from an oxide film. A conductive layer 102 for a floating gate may be formed over the entire surface, including the tunnel dielectric layer 101. The conductive layer 102 for the floating gate may be formed, for example, from a polysilicon film. A dielectric layer 103, a conductive layer 104 for a control gate, and a metal electrode layer 105 may be formed over the entire surface, including the conductive layer 102 for the floating gate. The dielectric layer 103, the conductive layer 104 for a control gate, and the metal electrode layer 105 may be formed sequentially over the entire surface. The dielectric layer 103 may have, for example, an oxide/nitride/oxide (ONO) structure in which a first oxide film, a nitride film, and a second oxide film are formed sequentially. The conductive layer 104 for the control gate may be formed, for example, from a polysilicon film. The metal electrode layer 105 may be formed, for example, from $WSi_x$. The metal electrode layer 105 may be formed, for example, using a Monosilane (MS) or Dichlorosilane (DCS) method.

A first hard mask film 106, a second hard mask film 107, a third hard mask film 108, and an Anti-Reflective Coating (ARC) layer 109 may be formed over the entire surface, including the metal electrode layer 105. The first hard mask film 106, the second hard mask film 107, the third hard mask film 108, and the Anti-Reflective Coating (ARC) layer 109 may be formed sequentially over the entire surface. The first hard mask film 106 may be formed, for example, from an oxide film. The second hard mask film 107 may be formed, for example, from an amorphous carbon layer. The third hard mask film 108 may be formed, for example, from SiON. Thereafter, a photoresist pattern 110 may be formed over the third hard mask film 108 by performing exposure and phenomenon processes after a resists material is coated.

Figure 3:
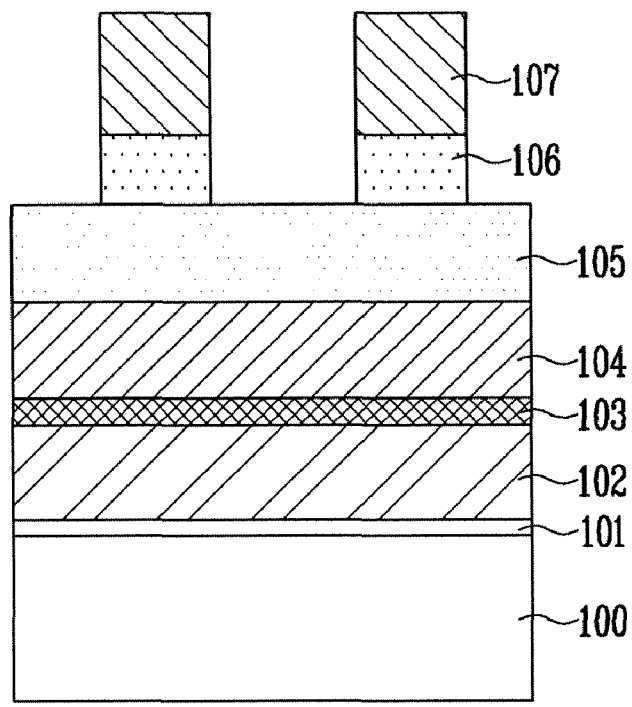

Referring to FIG. 3, the third hard mask film may be etched using, for example, an etch process employing the photoresist pattern, thus forming an etch mask pattern. The first and second hard mask films 106, 107 may be patterned using the etch mask pattern. The third hard mask film may then be removed. A further etch process may be performed with or without removal of the ARC layer.

Figure 4:
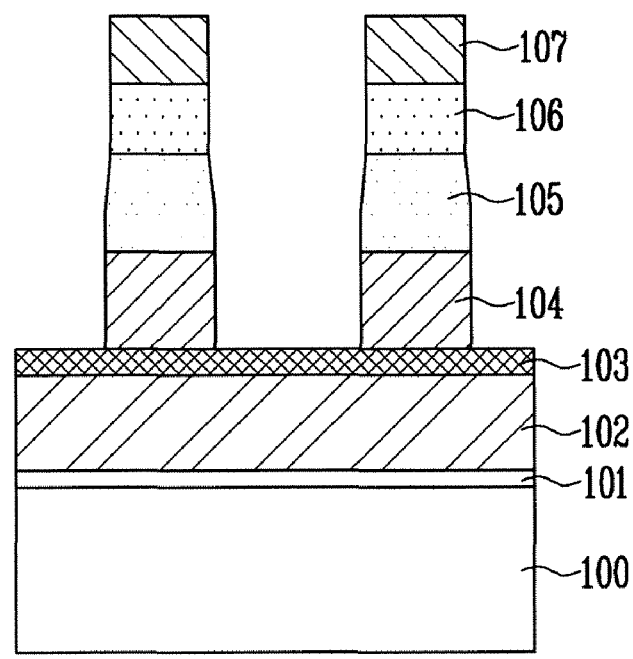

Referring to FIG. 4, the metal electrode layer 105 and the conductive layer 104 for the control gate may be etched using an etch process employing the first and second hard mask films 106, 107 so that the dielectric layer 103 is exposed. In this etch process, the process of etching the metal electrode layer 105 may be divided into a first etch process and a second etch process. In the first etch process, for example, an Ar gas having a molecular weight higher than that of a helium (He) gas may be used in order to increase an anisotropic etch characteristic of plasma. The first etch process may be performed, for example, using the metal electrode layer 105 as a target. Further, in order to reduce a positive slope of a lower sidewall of the metal electrode layer 105 while improving a bowing phenomenon of the metal electrode layer 105, the first etch process may be performed under conditions where a source power of approximately 800 to 1200 W is used, a bias power of about 40 to 100 W is used, a dilution gas of Ar is used, $NF_3$ of about approximately 20 to 30 sccm is used, and an over etch target is set to approximately 20 to 40% in a low pressure range of approximately 4 to 10 mT. In other words, the positive slope of an upper sidewall of the metal electrode layer 105 may be formed larger than the positive slope of a lower sidewall of the metal electrode layer 105. The second etch process may be performed using, for example, $NF_2$ gas, $Cl_2$ gas, and Ar gas in order to over etch the metal electrode layer 105.

Figure 5:
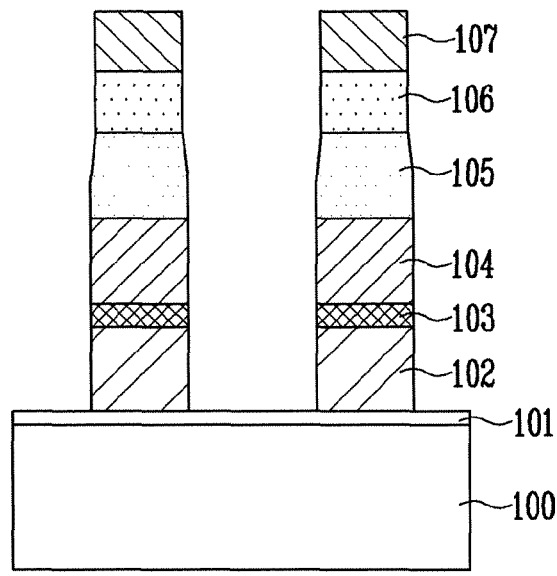

Referring to FIG. 5, the dielectric layer 103 and the conductive layer 102 for the floating gate may be etched by performing an etch process, thus forming gate patterns. The etch process may be performed, for example, in-situ with the above etch process of the metal electrode layer 105 and the conductive layer 104 for the control gate.

Figure 6:
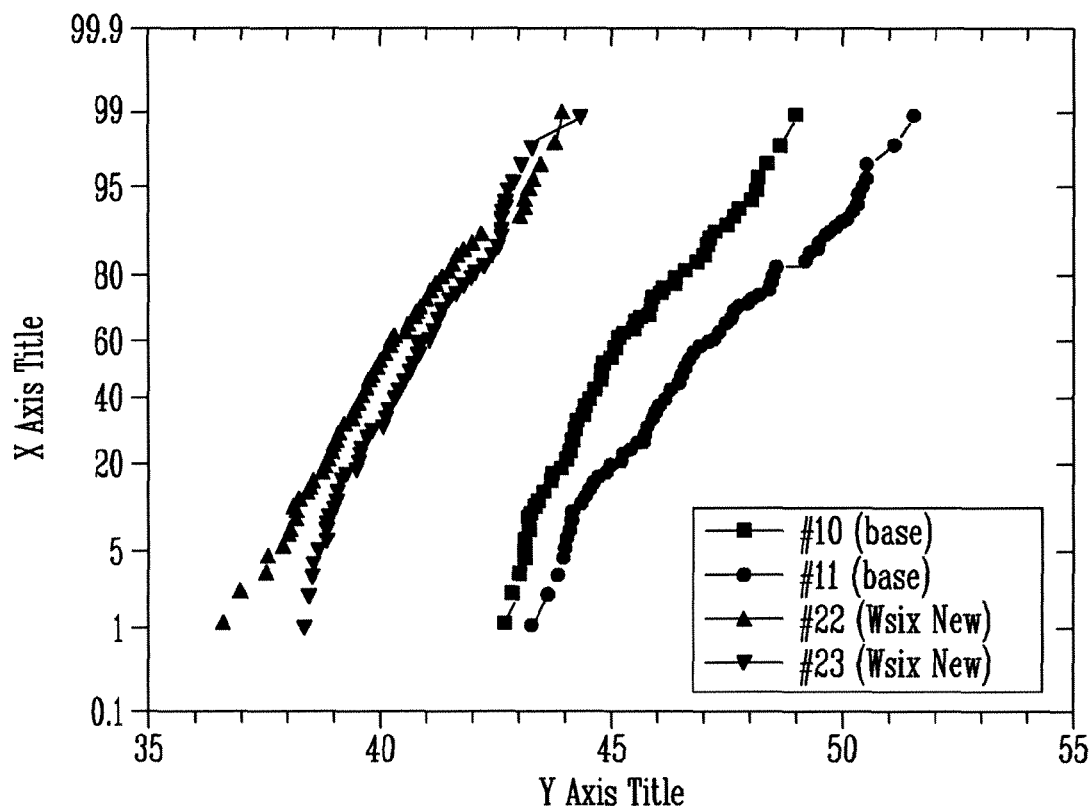
FIG. 6 is a graph illustrating word line resistance of the flash memory device according to the prior art and an embodiment of the present invention.

FIG. 6 is a graph illustrating word line resistance of the flash memory device according to the prior art and an embodiment of the present invention. From FIG. 6, it can be seen that word line resistance of the flash memory device according to an embodiment of the present invention is reduced about 15% to 20% when compared with that of the prior art.

Although the foregoing description has been made with reference to the specific embodiment, it is to be understood that changes and modifications of the present invention may be made by one of ordinary skill in the art without departing from the spirit and scope of the present invention and appended claims.

What is claimed is:

1. A method of forming a gate pattern of a flash memory device, comprising the steps of:

forming a tunnel dielectric layer, a conductive layer for a floating gate, a dielectric layer, a conductive layer for a control gate, a metal electrode layer, and a hard mask film over a semiconductor substrate;

etching the hard mask film to form hard mask pattern;

etching the metal electrode layer to form metal electrode patterns by anisotropic plasma etching including a first etching process and a second etching process, wherein the first etching process is performed using an Ar gas and the second etching process is performed using an Ar gas by setting over etch target;

etching the exposed conductive layer for the control gate, the dielectric layer, and the conductive layer for the floating gate.

2. The method of claim 1, wherein the tunnel dielectric layer, the conductive layer for a floating gate, the dielectric layer, the conductive layer for a control gate, the metal electrode layer, and the hard mask film are formed sequentially over the semiconductor substrate.

3. The method of claim 1, wherein the exposed conductive layer for the control gate, the dielectric layer, and the conductive layer for the floating gate are etched sequentially.

4. The method of claim 1, wherein the hard mask film comprises an oxide film, an amorphous carbon layer, a SiON layer, and an Anti-Reflective Coating (ARC) layer.

5. The method of claim 4, wherein the oxide film, the amorphous carbon layer, the SiON layer, and the ARC layer are formed sequentially.

6. The method of claim 1, wherein the conductive layer for the floating gate and the conductive layer for the control gate are formed from a polysilicon film.

7. The method of claim 1, wherein the dielectric layer has an oxide/nitride/oxide structure, wherein a first oxide film, a nitride film, and a second oxide film are formed sequentially.

8. The method of claim 1, wherein the metal electrode layer is formed from $WSi_x$.

9. The method of claim 1, wherein the metal electrode layer is formed using a Monosilane (MS) or a Dichlorosiline (DOS) method.

10. The method of claim 1, wherein the first etch process is performed using $NF_3$ of approximately 20 sccm to 30 sccm.

11. The method of claim 1, wherein the first etch process is performed using a source power of approximately 800 W to 1200 W and a bias power of approximately 40 W to 100 W in a low-pressure range of approximately 4 mT to 10 mT.

12. The method of claim 1, wherein the second etch process is performed by setting an over etch target to approximately 20% to 40%.

13. The method of claim 1, wherein the second etch process is performed using $NF_2$ gas, $Cl_2$ gas, and Ar gas.

14. The method of claim 1, wherein the first and second etch processes are performed in inductively coupled plasma (ICP) type equipment.

15. The method of claim 1, wherein the etch step of the conductive layer for the control gate and the dielectric layer is performed in-situ with the etch step of the metal electrode layer.

16. The method of claim 1, wherein in the etching of the metal electrode layer, a positive slope of an upper sidewall of the metal electrode layer is formed larger than a positive slope of a lower sidewall of the metal electrode layer.

* * * * *